(12) United States Patent
Lee (10) Patent No.: US 7,120,081 B2
(45) Date of Patent: Oct. 10, 2006

(54) MULTI-PORT MEMORY DEVICE WITH STACKED BANKS

(75) Inventor: Seung-hoon Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 205 days.

(21) Appl. No.: 10/858,659

(22) Filed: Jun. 1, 2004

(65) Prior Publication Data
US 2004/0246807 A1    Dec. 9, 2004

(30) Foreign Application Priority Data
Jun. 3, 2003    (KR) ............... 10-2003-0035606

(51) Int. Cl.
*G11C 8/00* (2006.01)

(52) U.S. Cl. ............... 365/230.05; 365/189.04; 365/189.05

(58) Field of Classification Search ........... 365/230.05, 365/230.03, 189.04, 189.05, 189.12
See application file for complete search history.

(56) References Cited

U.S. PATENT DOCUMENTS

| | | | |
|---|---|---|---|
| 6,430,103 B1* | 8/2002 | Nakayama et al. | 365/230.03 |
| 6,603,683 B1* | 8/2003 | Hsu et al. | 365/189.04 |
| 6,714,477 B1* | 3/2004 | Nakayama et al. | 365/230.03 |
| 6,940,753 B1* | 9/2005 | Cernea | 365/185.08 |
| 2001/0012232 A1 | 8/2001 | Nakayama et al. | |
| 2002/0176308 A1 | 11/2002 | Nakayama et al. | |
| 2004/0205305 A1* | 10/2004 | Lee et al. | 711/149 |
| 2005/0047255 A1* | 3/2005 | Park et al. | 365/230.05 |

* cited by examiner

*Primary Examiner*—Gene N. Auduong
(74) *Attorney, Agent, or Firm*—Marger Johnson & McCollom, P.C.

(57) ABSTRACT

A multi-port memory device with stacked banks is provided. The multi-port memory device includes a number of ports, and a plurality of stacked banks, two or more of which share one data line sense amplifier. Each stacked bank includes a plurality of memory cells. Data line sense amplifiers are connected respectively between the stacked banks and read buffers to sense data read from memory cells of a selected bank among the stacked banks. The read buffers are connected respectively to the ports, store memory cell data output from the data line sense amplifiers, and output the stored data to the ports. Read data lines connect the data line sense amplifiers with the read buffers, respectively. Write buffers are connected respectively to the ports, and convert and store write data received in serial through the ports in a parallel form. Write data lines connect the data line drivers with the write buffers, respectively. Accordingly, since a plurality of stacked banks can be accessed independently and can perform reading and writing operations independently, a data throughput increases and a data reading speed and data writing speed are improved.

20 Claims, 6 Drawing Sheets

MULTI-PORT MEMORY DEVICE WITH STACKED BANKS

BACKGROUND OF THE INVENTION

This application claims the priority of Korean Patent Application No. 2003-35606, filed on Jun. 3, 2003, in the Korean Intellectual Property Office, the disclosure of which is incorporated herein in its entirety by reference.

1. Field of the Invention

This disclosure relates to a multi-port memory device, and more particularly, to a multi-port memory device in which each of stacked banks is operated independently.

2. Description of the Related Art

In a general dual-port memory device, a pair of data is read from a memory cell array through an output port and simultaneously is written to the memory cell array through an input port. Such a dual-port memory device can be used as a video memory device for video cameras, etc. However, since the dual-port memory device has a limited number of ports allowing simultaneous access, a multi-port memory device capable of reserving a required number of ports as necessary is required to achieve high-functionality and high definition.

The multi-port memory device performs a bank access operation independently through a multi-channel. An operation speed of the multi-port memory device is dependent on the independent bank access operation and independent reading and writing operations. The independent reading and writing operations are closely related to a data line structure in the multi-port memory device.

Figure 1:
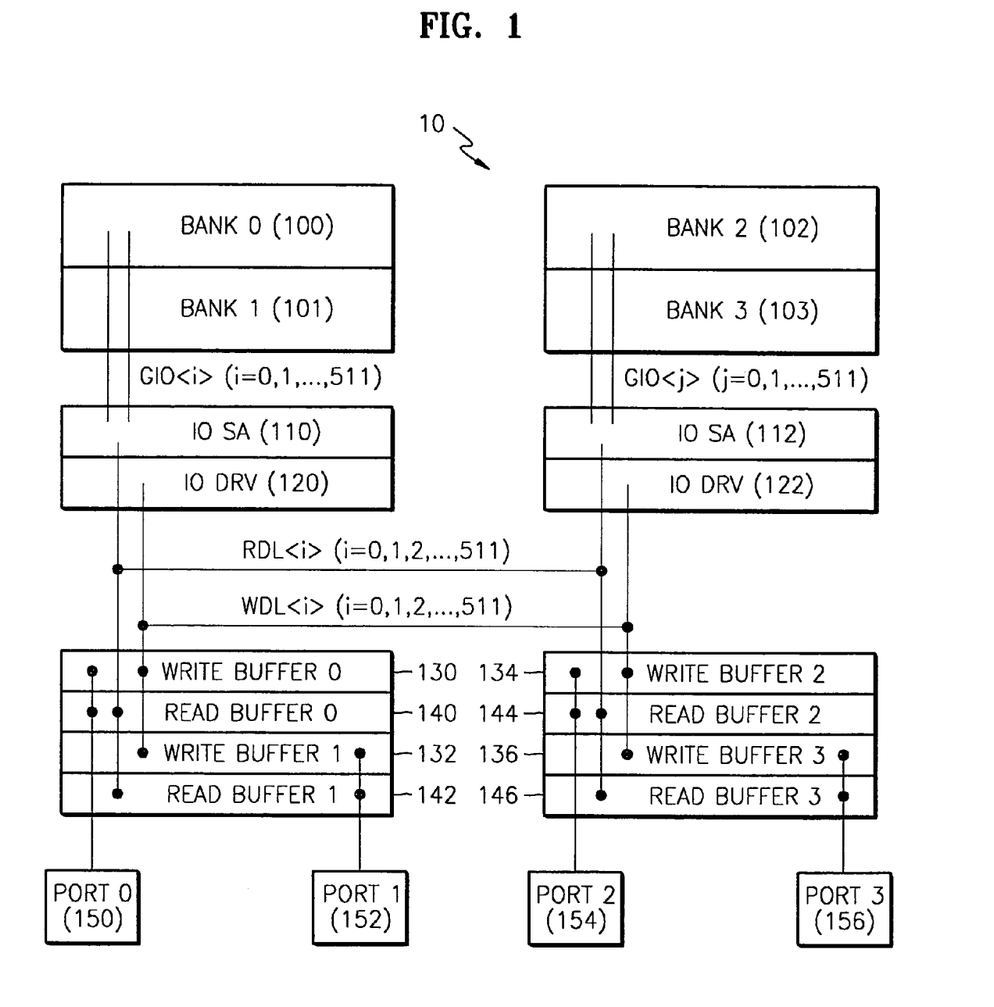
FIG. 1 is a block diagram illustrating a conventional multi-port memory device.

FIG. 1 is a view for explaining an internal structure of a conventional multi-port memory device. Referring to FIG. 1, a multi-port memory device 10 includes a number of banks bank0 100, bank1 101, bank2 102, and bank3 103; data line sense amplifiers IO SA 110 and IO SA 112; data line drivers IO DRV 120 and IO DRV 122; write buffers 130, 132, 134, and 136; read buffers 140, 142, 144, and 146; and a number of ports port0 150, port1 152, port2 154, and port3 156. The bank0 100, bank1 101, bank2 102, and bank3 103 form a stacked bank structure. Multi-bit data, for example, 512 bit data is input or output through the ports 150, 152, 154, and 156.

The bank0 100 and bank1 101 are connected to a first data line sense amplifier 110 or a first data line driver 120 through first global data lines GIO<i>, i=0, 1, 2, . . . , 511. The bank2 102 and bank3 103 are connected to a second data line sense amplifier 112 or a second data line driver 122 through second global data lines GIO<j>, j=0, 1, 2, . . . , 511. The data line sense amplifiers 110 and 112 are connected to the read buffers 140, 142, 144, and 146 through read data lines RDL. The read buffers 140, 142, 144, and 146 are connected to the ports 150, 152, 154, and 156, respectively. The data line drivers 120 and 122 are connected to the write buffers 130, 132, 134, and 136 through a write data line WDL. The write buffers 130, 132, 134, and 136 are connected to the ports 150, 152, 154, and 156, respectively.

Figure 2:
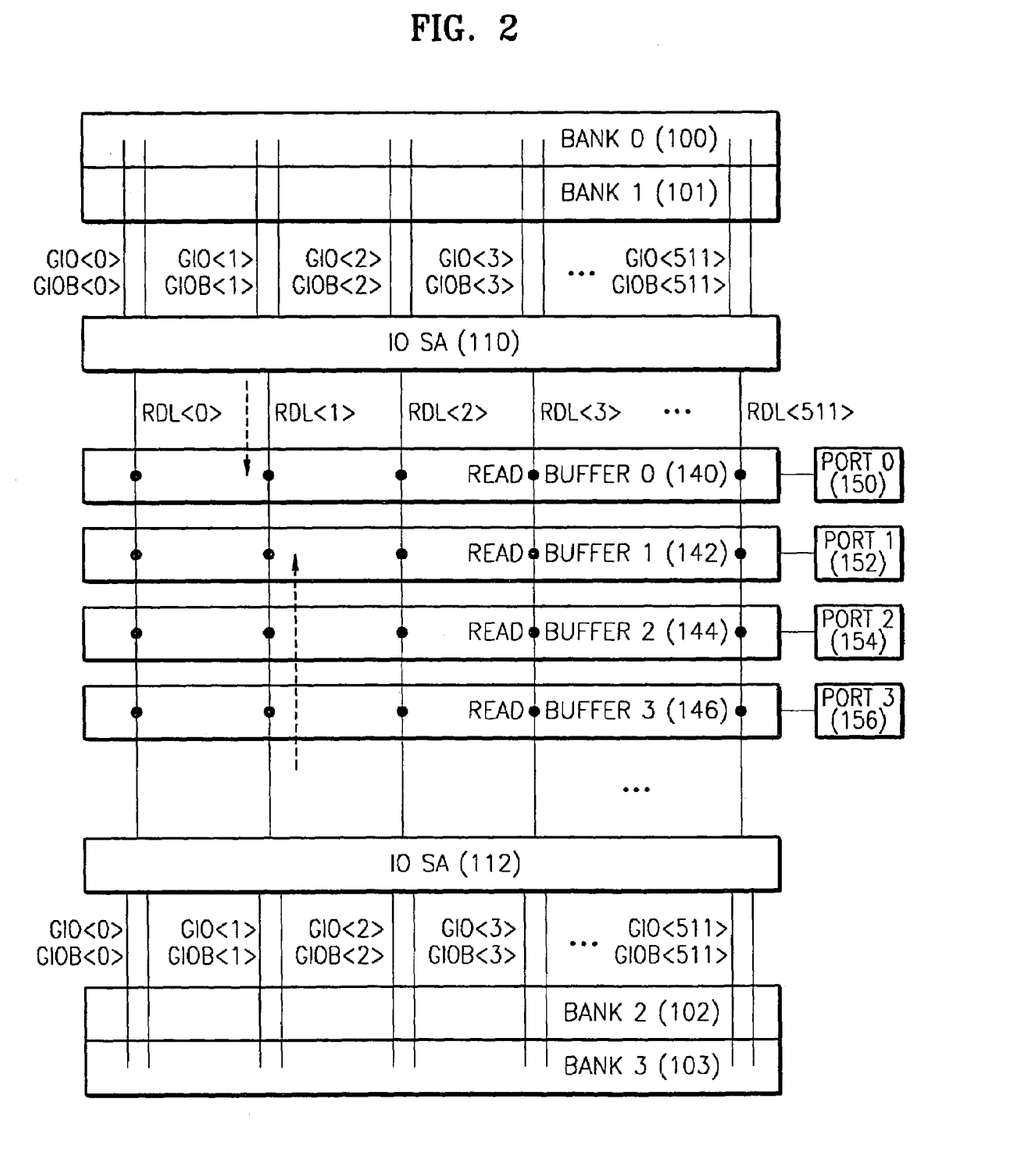
FIG. 2 is a block diagram illustrating a read path of the multi-port memory device shown in FIG. 1.

The reading and writing operations of the multi-bank memory device 10 having the above-described structure are described below. FIG. 2 is a block diagram for explaining a read data path of the multi-bank memory device 10. Referring to FIG. 2, 512 bit memory cell data read form the bank0 100 and bank1 101 is transferred to the first data line sense amplifier 110 through first global data lines GIO<0>, GIO<1>, GIO<2>, . . . , GIO<511>. 512 bit memory cell data read from the bank2 102 and bank3 103 is transferred to the second data line sense amplifier 112 through the second global data lines GIO<0>, GIO<1>, GIO<2>, . . . , GIO<511>. The first data line sense amplifier 110 and the second data line sense amplifier 112 share read data lines RDL<0>, RDL<1>, RDL<2>, . . . , RDL<511>.

Since the first and the second data line sense amplifiers 110 and 112 share the read data lines RDL, only one of the first and the second data line sense amplifiers 110 and 112 is selectively connected to the read buffers 140, 142, 144, and 146. If the first data line sense amplifier 110 is connected to the read data lines RDL<0>, RDL<1>, RDL<2>, . . . , RDL<511>, the 512 bit memory cell data selected in the bank0 100 and bank1 101 is sensed and amplified by the first data line sense amplifier 110 and is stored in one of the read buffers 140, 142, 144, and 146. For example, it can be stored in the first read buffer 150 through the read data lines RDL<0>, RDL<1>, RDL<2>, . . . , RDL<511>. The 512 bit data stored in the first read buffer 140 can then be sequentially output through the port0 150.

Here, while the memory cell data read from the bank0 100 and bank1 101 is accessed and is output through the read buffer 140 and the port0 150, memory cell data of the bank2 102 and the bank3 103 cannot be accessed.

Figure 3:
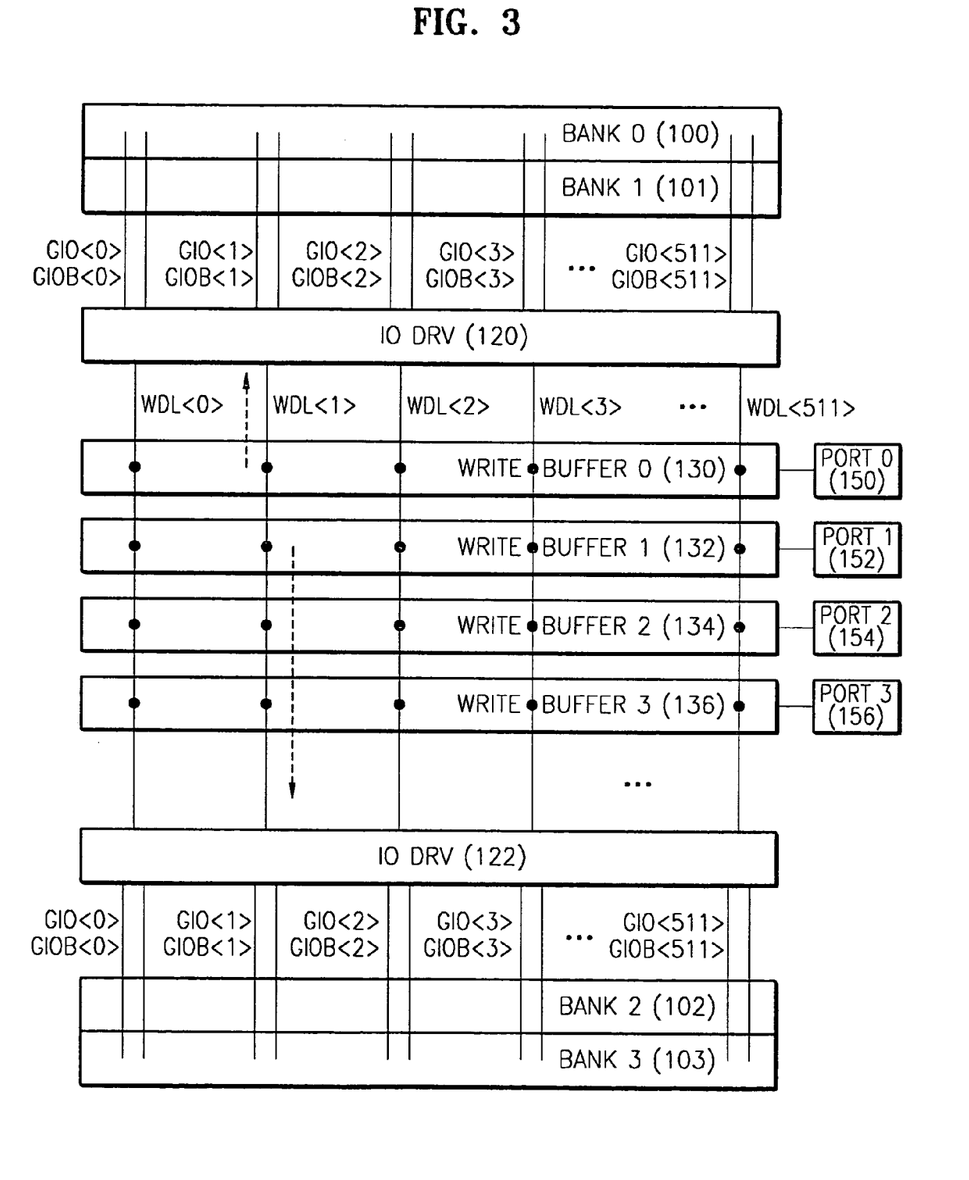
FIG. 3 is a block diagram illustrating a write path of the multi-port memory device shown in FIG. 1.

FIG. 3 is a block diagram for explaining a write data path of the multi-port memory device shown in FIG. 1. Referring to FIG. 3, similar to the read data path of FIG. 2, for example, write data received through the port0 150 is sequentially stored in a first write buffer 130 and constructs 512 bit data. The 512 bit data stored in the first write data buffer 130 is transferred, for example, to a first data line driver 120 through write data lines WDL<0>, WDL<1>, WDL<2>, . . . , WDL<511>. The first data line driver 120 is connected to the bank0 100 or bank1 101 through the global data lines GIO<0>, GIO<1>, GIO<2>, . . . , GIO<511>, and stores the write data in a selected bank, for example, in the 512 memory cells of the bank0 100.

Similar to the read operation, while the write data received through the port0 150 and the write buffer 130 is accessed to the memory cells of the bank0 100 or the bank1 101 and is stored therein, the write data cannot access the memory cells of the bank2 102 and bank3 103.

As described above, since in the conventional multi-port memory device 10, the stacked bank0 100 and bank1 101, and the bank2 102 and bank3 103 cannot be accessed independently, a limitation exists in a data read speed and data write speed. For this reason, a multi-port memory device having a stacked bank structure allowing independent access and capable of performing independent reading and writing operations is necessary.

Embodiments of the invention address these and other limitations in the prior art.

SUMMARY OF THE INVENTION

Embodiments of the present invention provide a multi-port memory device having a stacked bank structure allowing independent access. Therefore, according to multi-port memory devices of the present invention, since each of a plurality of stacked banks can be accessed independently and can read or write data independently, a data throughput increases and a data reading speed and data writing speed are improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings. Similar components in the respective drawings are denoted by the same reference number.

For convenience of descriptions, the embodiments of the present invention are described for a multi-port memory device including four ports and two stacked banks. It will be understood by those of ordinary skill in the art that various changes in the number of ports and stack banks may be made based on this specification.

Figure 4:
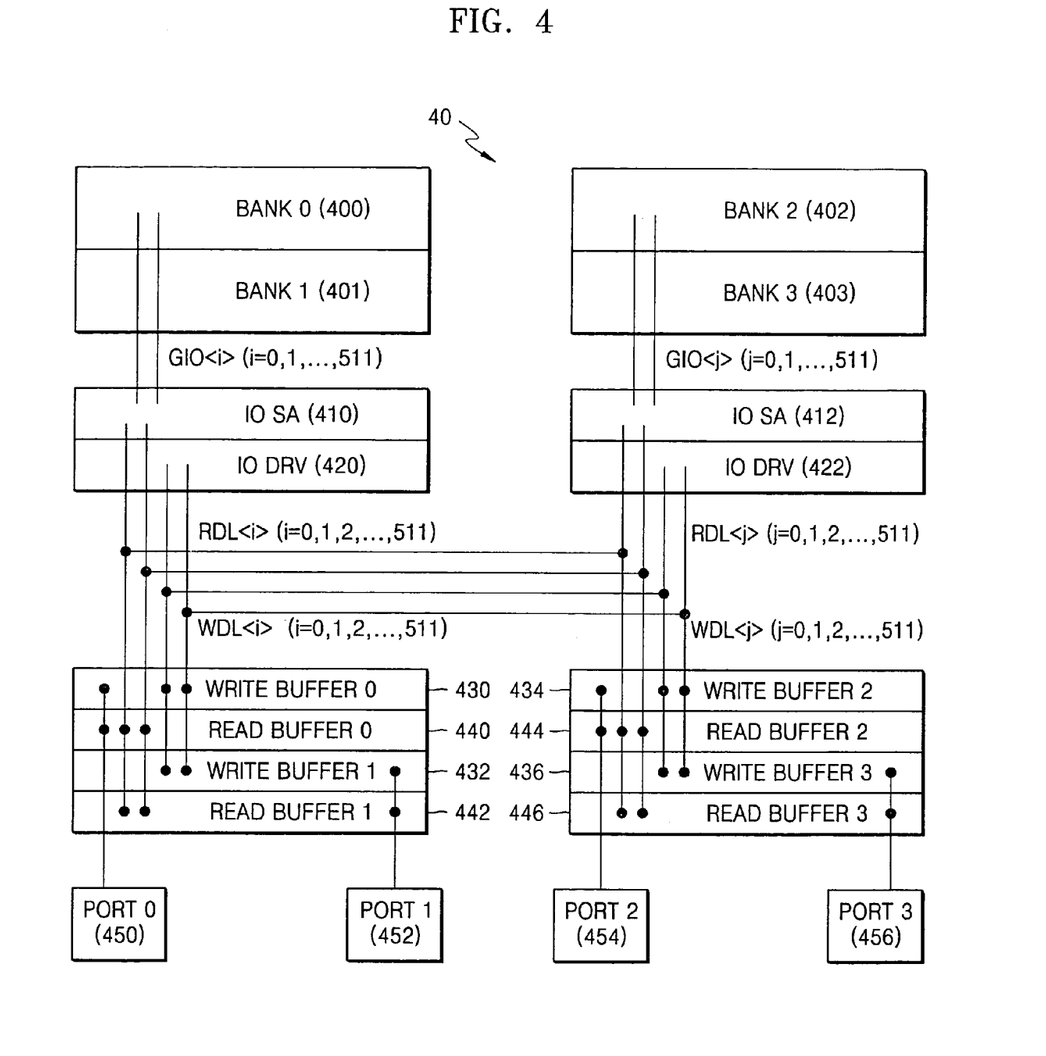
FIG. 4 is a block diagram illustrating a multi-port memory device according to an embodiment of the invention.

FIG. 4 is a block diagram illustrating a multi-port memory device according to an embodiment of the invention. The example multi-port memory device 40 of FIG. 4 includes first stacked banks, bank0 400 and bank1 401, second stacked banks, bank2 402 and bank3 403, data line sense amplifiers IO SA 410 and IO SA 412, data line drivers IO DRV 420 and IO DRV 422, write buffers 430, 432, 434, and 436, read buffers 440, 442, 444, and 446, and ports port0 450, port1 452, port2 454, and port3 456.

The bank0 400 and bank1 401 are connected to the first data line sense amplifier 410 and a first data line driver 420 through first global data lines GIO<i>, i=0–511. The bank2 402 and bank3 403 are connected to a second data line sense amplifier 412 and a second data line driver 422 through second global data lines GIO<j>, j=0–511. The first and the second data line sense amplifiers 410 and 412 are connected to the read buffers 440, 442, 444, and 446 through first read data lines RDL<i>, i=0–511 and second read data lines RDL<j>, j=1–511.

The first and the second data line drivers 420 and 422 are connected to the write buffers 430, 432, 434, and 436 through first write data lines WDL<i>, i=1–511 and second write data lines WDL<j>, j=0–511. The first write buffer 430 and a first read buffer 440 are connected to the port0 450, the second write buffer 432 and a second read buffer 442 are connected to the port1 452, the third write buffer 434 and a third read buffer 444 are connected to the port2 454, and the fourth write buffer 436 and a fourth read buffer 446 are connected to the port3 456.

The multi-port memory device 40 of FIG. 4 further includes the second read data lines RDL<j>, j=0–511 connected between the first and the second data line sense amplifiers 410 and 412 and the read buffers 440, 442, 444, and 446; and the second write data lines WDL<j>, j=0–511 connected between the first and the second data line drivers 420 and 422 and the write buffers 430, 432, 434, and 436, compared to the multi-port memory device 10 of FIG. 1.

The first and the second read data lines RDL<i>, RDL<j>, i, j=0–511 connected respectively to the data line sense amplifier 410 and 412, and the first and the second write data lines WDL<i>, WDL<j>, i,j=0–511 connected respectively to the data line drivers 420 and 422 are provided to allow independently operation of the data line sense amplifiers 410 and 412 and the data line drivers 420 and 422.

The reading and writing operations of the multi-port memory device 40 according to this embodiment of the present invention are described below with reference to FIGS. 5 and 6.

Figure 5:
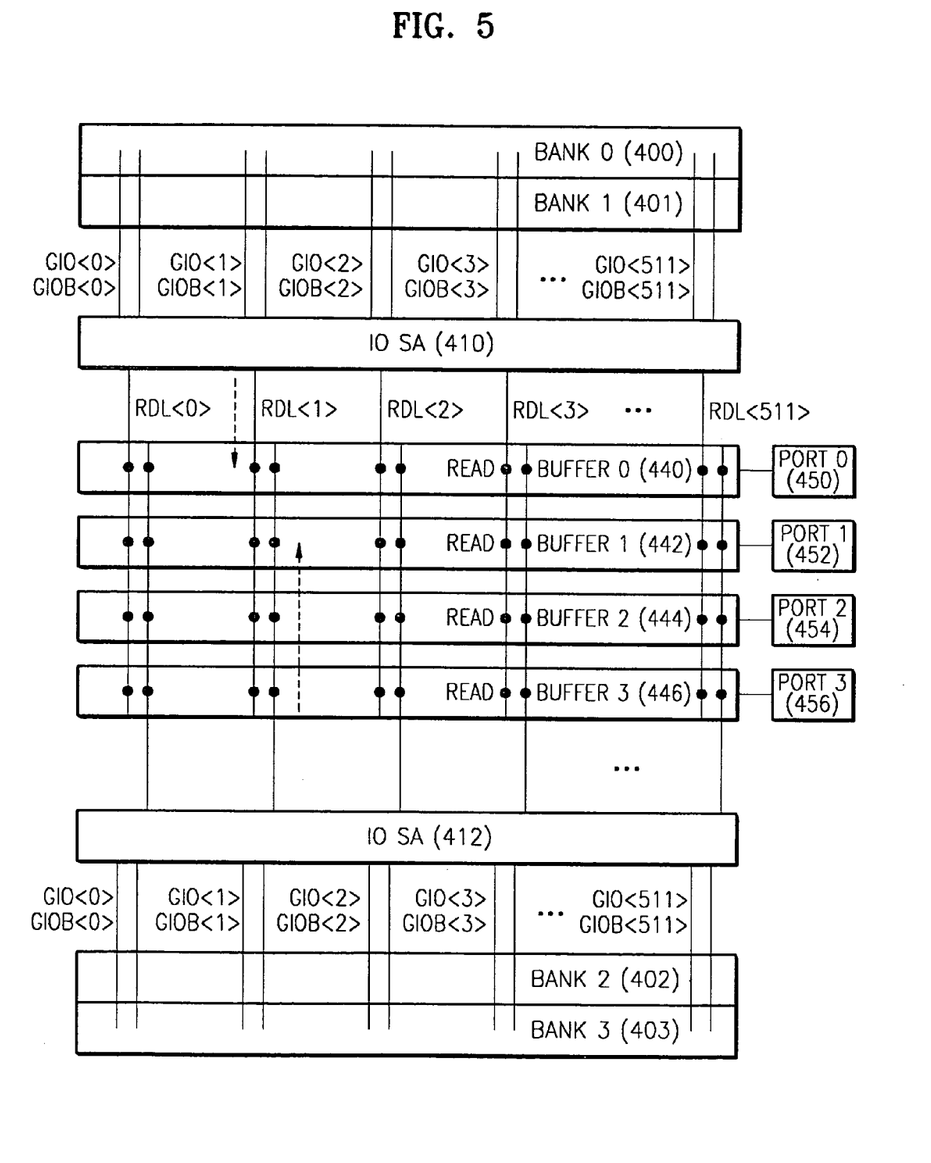
FIG. 5 is a block diagram illustrating a read path of the multi-port memory device shown in FIG. 4.

FIG. 5 is an example block diagram for explaining a read path of the multi-port memory device 40 shown in FIG. 4. Referring to FIG. 5, 512 bit memory cell data read from the bank0 400 and the bank1 401 are transferred to the first data line sense amplifier 410 through the first global data lines GIO<0>, GIO<1>, GIO<2>, . . . , GIO<511>. The 512 bit memory cell data read from the bank2 402 and the bank3 403 is transferred to the second data line sense amplifier 412 through the second global data lines GIO<0>, GIO<1>, GIO<2>, . . . , GIO<511>. The first data line sense amplifier 410 is connected to the read buffers 440, 442, 444, and 446 through the first read data lines RDL<0>, RDL<1>, RDL<2>, . . . , RDL<511>. The second data line sense amplifier 412 is connected to the read buffers 440, 442, 444, and 446 through the second read data lines RDL<0>, RDL<1>, RDL<2>, . . . , RDL<511>.

The 512 bit memory cell data selected in the bank0 400 and the bank1 401 is sensed and amplified by the first data line sense amplifier 410 and is stored in one of the read buffers 440, 442, 444, or 446, for example, in the first read buffer 440 through the first read data lines RDL<0>, RDL<1>, RDL<2>, . . . , RDL<511>. The 512 bit memory cell data selected in the bank2 402 and bank3 403 is sensed and amplified by the second data lines sense amplifier 412, and is stored in another one of the read buffers 440, 442, 444, or 446, for example, in the second read buffer 442 through the second read data lines RDL<0>, RDL<1>, RDL<2>, . . . , RDL<511>. The 512 bit data stored in the first read buffer 440 is sequentially output through the port0 450 and the 512 bit data stored in the second read buffer 442 is sequentially output through the port1 452.

Here, while the memory cell data read from the bank0 400 and bank1 401 is accessed and is output through the first read buffer 440 and the port0 450, the memory cell data read from the bank2 402 and the bank3 403 can be accessed and is output through the second read buffer 442 and the port1 452 simultaneously. In a conventional multi-port memory device 10 shown in FIG. 1, since the stacked bank0 100 and bank1 101, and the bank2 102 and bank3 103 cannot be accessed independently, this limits a data read speed of the multi-port memory device 10. However, in this embodiment of the present invention, since the stacked bank0 400 and bank1 401, and the bank2 402 and bank3 403 can be accessed independently, a reading speed of the multi-port memory device 40 increases.

Figure 6:
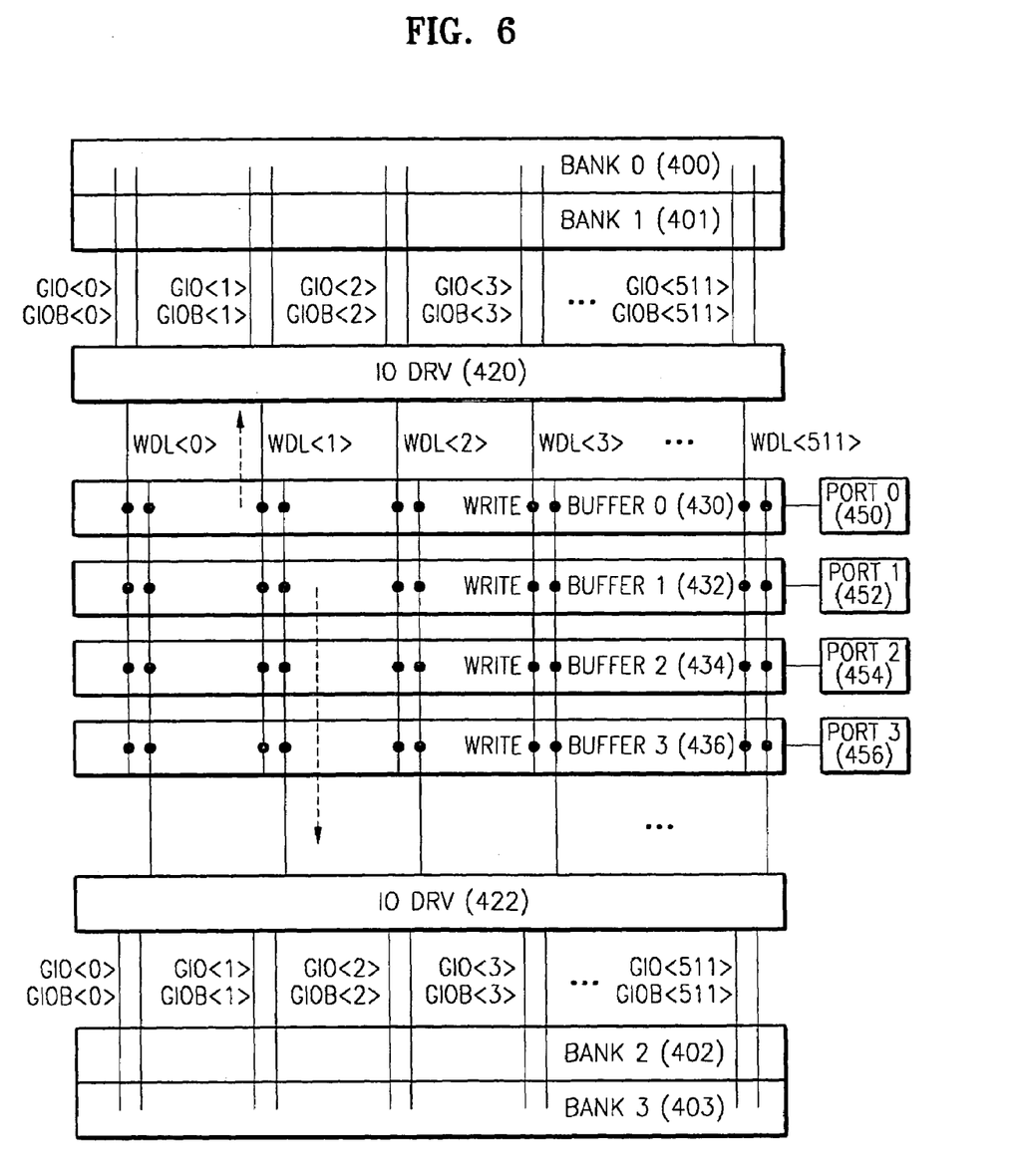
FIG. 6 is a block diagram illustrating a write path of the multi-port memory device shown in FIG. 4.

FIG. 6 is an example block diagram for describing a write path of the multi-port memory device 40. Referring to FIG. 6, write data received through the port 450 is sequentially stored in the first write buffer 430 and constructs 512 bit data. The 512 bit data stored in the first write data buffer 430 is transferred, for example, to the first data line driver 420 through the first write data lines WDL<0>, WDL<1>, WDL<2>, . . . , WDL<511>. Meanwhile, for example, write data received through the port1 452 is sequentially stored in the second write buffer 432 and constructs 512 bit data. The 512 bit data stored in the second write data buffer 432 is transferred, for example, to the second data line driver 422 through the second write data lines WDL<0>, WDL<1>, WDL<2>, . . . , WDL<511>.

The first data line driver 420 is connected to the bank0 400 or bank1 402 through the first global data lines GIO<0>, GIO<1>, GIO<2>, . . . , GIO<511>and stores the write data in a selected bank, for example, in the 512 memory cell of the bank0 400. The second data line driver 422 is connected to the bank2 402 or bank3 403 through the second global data line GIO<0>, GIO<1>, GIO<2>, . . . , GIO<511>and stores the write data in a selected bank, for example, in the 512 memory cells of the bank2 402.

Similar to the reading operation, while the write data received through the port0 450 and the first write buffer 430 is accessed to the memory cells of the bank0 400 or bank1 401 and is stored therein, the write data received through the port1 452 and the second write buffer 432 is accessed to the memory cells of the bank3 402 or bank3 403 and is stored therein. Therefore, according to this embodiment of the present invention, the stacked bank0 400 and bank1 401, and the bank2 402 and bank3 403 are accessed independently, which means that a data write speed of the multi-port memory device 40 increases.

Although implementations of the invention can take many forms, particular embodiments are described below as example embodiments. Of course, the inventive concepts contained herein are not limited to these preferred embodiments.

According to an aspect of the present invention, there is provided a multi-port memory device including: a number of ports; a plurality of stacked banks two or more of which share one data line sense amplifier, each stacked bank including a plurality of memory cells; data line sense amplifiers, which are connected respectively between the stacked banks and read buffers and sense data read from memory cells of a selected bank among the stacked banks; read buffers, which are connected respectively to the ports, store memory cell data output from the data line sense amplifiers, and output the stored data to the ports; and read data lines which connect the data line sense amplifiers with the read buffers, respectively. The data line sense amplifiers sense data read in parallel from the memory cells of the selected bank among the stacked banks. The read buffers output the memory cell data output from the data line sense amplifiers in serial to the ports.

According to another aspect of the present invention, there is provided a multi-port memory device including: a number of ports; a number of stacked banks two or more of which share one data line driver, each stacked bank including a plurality of memory cells; write buffers, which are connected respectively to the ports and store write data received through the ports; data line drivers, which are connected respectively between the stacked banks and the write buffers and drive the write data using memory cells of a selected bank among the stacked banks; and write data lines which connect the data line drivers with the write buffers, respectively. The write buffers convert and store write data received in serial through the ports in a parallel form. Additionally, the data line drivers can drive the write data in parallel using the memory cells of the selected bank among the stacked banks.

According to still another aspect of the present invention, there is provided a multi-port memory device including: a number of ports which input or output data bidirectionally; a number of stacked banks two or more of which share one data line sense amplifier and one data line driver, each stacked bank including a number of memory cells; data line sense amplifiers, which are connected between the stacked banks and read buffers and sense data read from memory cells of a selected bank among the stacked banks; data line drivers, which are connected respectively between the stacked banks and write buffers and drive write data using memory cells of a selected bank among the stacked banks; read buffers, which are connected respectively to the ports, store memory cell data output from the data line sense amplifiers, and output the stored memory cell data to the ports; write buffers, which are connected respectively to the ports and store write data received through the ports; read data lines which connect the data line sense amplifiers with the read buffers, respectively; and write data lines which connect the data line drivers with the write buffers, respectively.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-port memory device comprising:
a plurality of buffers;
a plurality of stacked banks, each of the plurality of stacked banks including a plurality of memory cells;
data line sense amplifiers respectively coupled between the plurality of stacked banks and the plurality of buffers, the data line sense amplifiers structured to sense data read from memory cells of selected banks of the plurality of stacked banks; and
a plurality of read data lines which respectively couple the data line sense amplifiers to the plurality of buffers, the plurality of read data lines structured to simultaneously transmit data from the data line sense amplifiers to the plurality of buffers.

2. The multi-port memory device of claim 1, wherein the data line sense amplifiers are structured to sense data read in parallel from the memory cells of the selected bank.

3. The multi-port memory device of claim 1 further comprising a plurality of ports respectively coupled to the plurality of buffers, and wherein the plurality of buffers are structured to output the memory cell data from the data line sense amplifiers in serial to the plurality of ports.

4. A multi-port memory device comprising:
a plurality of ports;
a plurality of stacked banks two or more of which share one data line driver, each stacked bank including a plurality of memory cells;
a plurality of write buffers coupled respectively to the ports and structured to store write data received through the ports;
data line drivers coupled respectively between the stacked banks and the plurality of write buffers and structured to drive the write data using memory cells of a selected bank among the plurality of stacked banks; and
write data lines respectively coupling the data line drivers to the plurality of write buffers.

5. The multi-port memory device of claim 4, wherein the write buffers are structured to convert and store write data received in serial through the ports in a parallel form.

6. The multi-port memory device of claim 4, wherein the data line drivers are structured to simultaneously drive the write data on the write data lines to the plurality of write buffers.

7. A multi-port memory device comprising:
a plurality of bi-directional data ports;

a plurality of stacked banks, each stacked bank including a plurality of memory cells;

data line sense amplifiers respectively coupled to the plurality of stacked banks and structured to sense data read from memory cells of a selected bank of the plurality of stacked banks;

data line drivers respectively coupled between the stacked banks and write buffers and structured to drive write data using memory cells of a selected bank of the plurality of stacked banks;

a plurality of read buffers respectively coupled to the plurality of ports, the buffers structured to store memory cell data output from the data line sense amplifiers, and to output the stored memory cell data to the plurality of ports;

a plurality of write buffers respectively coupled to the ports and structured to store write data received through the ports;

read data lines that couple the data line sense amplifiers to the plurality of read buffers, wherein first data transmitted between a first sense amplifier and a first read buffer is transmitted simultaneously with second data transmitted between a second sense amplifier and a second read buffer; and write data lines that couple the data line drivers to the plurality of write buffers, wherein third data transmitted between a first write buffer and a first data line driver is transmitted simultaneously with fourth data transmitted between a second write buffer and a second data line driver.

8. The multi-port memory device of claim 7, wherein the data line sense amplifiers sense data read in parallel from the memory cells of the selected bank.

9. The multi-port memory device of claim 7, wherein the read buffers output the memory cell data output from the data line sense amplifiers in serial to the ports.

10. The multi-port memory device of claim 7, wherein the write buffers are structured to convert and store write data received in serial through the ports in a parallel form.

11. The multi-port memory device of claim 7, wherein the data line drivers are structured to drive the write data in parallel using the memory cells of the selected bank among the stacked banks.

12. A method comprising:
reading data from memory cells within stacked banks;
sensing data with at least two data line sense amplifiers; and
simultaneously transmitting the sensed data from at least two data line sense amplifiers to at least two buffers, respectively.

13. The method of claim 12 further comprising transmitting data from the at least two buffers to ports.

14. The method of claim 13, wherein transmitting data from the at least two buffers to ports comprises serially transmitting data.

15. The method of claim 12 further comprising writing data from the at least two buffers to data line drivers over a write data line.

16. A method comprising:
transmitting a first data to a port in a multi-port memory;
transmitting a second data to a different port in the multi-port memory;
storing the first data in memory cells within stacked banks in the multi-port memory; and
storing the second data in different memory cells within the stacked banks in the multi-port memory,
wherein storing the first data and storing the second data occurs simultaneously.

17. The method of claim 16, wherein transmitting the first data comprises serially transmitting data.

18. The method of claim 16, wherein transmitting the first data comprises transmitting data in parallel.

19. The method of claim 16 further comprising, accessing the first data in memory cells while concurrently accessing the second data in different memory cells.

20. A method comprising:
selecting first memory cell data to be read from a first memory cell in a plurality of stacked memory banks;
selecting second memory cell data to be read from a second memory cell in the plurality of stacked memory banks;
sensing and amplifying the first memory cell data with a first sense amplifier connected to a first buffer;
sensing and amplifying the second memory cell data with a second sense amplifier connected to a second buffer; and
storing the first memory cell data in the first buffer and the second memory cell data in the second buffer, wherein the first and second memory cell data is respectively stored to the first and second memory buffers substantially simultaneously.

* * * * *